(12) United States Patent
Yamazaki (10) Patent No.: US 7,664,157 B2
(45) Date of Patent: Feb. 16, 2010

(54) TUNABLE LASER

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/391,262

(22) Filed: Mar. 29, 2006

(65) Prior Publication Data

US 2006/0222039 A1    Oct. 5, 2006

(30) Foreign Application Priority Data

Mar. 29, 2005    (JP)    ............................. 2005-096225

(51) Int. Cl.
*H01S 3/083*    (2006.01)

(52) U.S. Cl. ........................................................ 372/94

(58) Field of Classification Search .................. 372/94
See application file for complete search history.

(56) References Cited

U.S. PATENT DOCUMENTS

| | | | | |
|---|---|---|---|---|
| 4,899,042 | A * | 2/1990 | Falk et al. ............... | 250/227.19 |
| 5,398,256 | A * | 3/1995 | Hohimer et al. ............ | 372/94 |
| 6,658,039 | B2 * | 12/2003 | Numai ......................... | 372/94 |
| 6,885,794 | B2 * | 4/2005 | Scheuer et al. ............... | 385/39 |
| 2003/0103541 | A1 | 6/2003 | Zheng | |
| 2004/0258107 | A1 | 12/2004 | Sherrer et al. | |
| 2005/0013537 | A1* | 1/2005 | Yamazaki .................... | 385/27 |
| 2006/0127007 | A1* | 6/2006 | Margalit et al. .............. | 385/39 |

FOREIGN PATENT DOCUMENTS

| | | |
|---|---|---|
| CN | 13-59178 | 7/2002 |
| JP | 62-100706 | 5/1987 |
| JP | 2002-185074 | 6/2002 |
| JP | 2003-215515 | 7/2003 |
| JP | 2003-283024 | 10/2003 |
| JP | 2003-302542 | 10/2003 |
| WO | WO 2004/034528 | 4/2004 |

OTHER PUBLICATIONS

Zhao et al., "Multi-wavelength lasing oscillation of a Vernier-type unidirectional $Er^{3+}$ -doped fiber compound ring", Applied Physics Letters, American Institute of Physics, vol. 70, No. 25, Jun. 23, 1997, pp. 3344-3346.

(Continued)

*Primary Examiner*—Minsun Harvey
*Assistant Examiner*—Patrick Stafford
(74) *Attorney, Agent, or Firm*—Young & Thompson (57) ABSTRACT

A tunable laser has a multiple ring resonator comprising a plurality of ring resonators having respective ring-shaped waveguides and respective different optical path lengths, an input/output side optical waveguide coupled to the multiple ring resonator, an optical input/output device such as a laser diode coupled to the input/output side optical waveguide, a reflection side optical waveguide coupled to the multiple ring resonator, an optical reflector coupled to the reflection side optical waveguide for removing light at an unwanted wavelength and reflecting light at a required wavelength, and a wavelength varying mechanism for changing the resonant wavelength of the multiple ring resonator.

23 Claims, 5 Drawing Sheets

OTHER PUBLICATIONS

Yamazaki et al., "Widely Tunable Laser Consisting of a Silica Waveguide Double Ring Resonator Connected Directly to a Semiconductor Optical Amplifier", Proceedings of the European Conference on Optical Communications, 2004, Post-Deadline Paper Th4.2.4, pp. 22-23, XP009066926.

Takahashi et al., "A Stable Widely Tunable Laser Using a Silica-Waveguide Triple-Ring Resonator". Optical Fiber Communications Conference, Post-Deadline Papers, vol. 5, Mar. 2005, PDP19.1-PDP19.3, XP-002382864.

Canadian Patent Office issued a Canadian Office Action dated Feb. 27, 2009, Application No. 2,541,072.

* cited by examiner

TUNABLE LASER

BACKGROUND OF THE INVENTION

1. Field of the Invention

The present invention relates to a tunable laser which can vary the oscillation wavelength thereof.

2. Description of the Related Art

As broadband communications are becoming more and more popular, attempts are being made to introduce WDM (Wavelength Division Multiplexing) transmission systems that are capable of communications at a plurality of different optical wavelengths over a single optical fiber for efficient utilization of fiber optic transmission paths. Recently, DWDM (Dense WSD) apparatus for multiplexing optical signals of several tens of wavelengths for more rapid transmission have also been finding growing use. Efforts have also been made to commercialize ROADM (Reconfigurable Optical Add/Drop Multiplexers) for adding and dropping optical signals of desired wavelengths at each node in the optical networks. If ROADM systems are introduced into the communication environment, then the flexibility of optical networks will dramatically be increased because they are capable of optical path switching by changing wavelengths as well as the transmission capacity is increased by wavelength multiplexing.

The WDM transmission system requires as many light sources as the number of wavelengths that are employed. Therefore, as the number of wavelengths to be multiplexed by the WDM transmission system increases, the number of light sources that are required also increases.

DFB-LDs (Distributed FeedBack Laser Diodes) which oscillate in a single axial mode have widely been used as light sources in WDM transmission systems for the ease and reliability with which they can be used. The DFB-LD has a diffraction grating having a depth of about 30 nm which is disposed entirely in the resonator. The DFB-LD oscillates stably in the single axial mode at a wavelength corresponding to the product of the period of the diffraction grating and a value that is twice the equivalent refractive index. However, since it is impossible to tune the DFB-LD for a wide range of oscillation wavelengths, a DFB-LD-based WDM transmission system employs DFB-LD devices having different wavelengths for respective ITU (International Telecommunication Union) grids. The need for using DFB-LD devices having different wavelengths makes the DFB-LD-based WDM transmission system problematic because the shelf control cost is high and a redundant inventory of DFB-LDs is required in preparation for DFB-LD failures. If the ROADM system that is capable of optical path switching by changing wavelengths employs ordinary DFB-LDs, then the variable extent of the wavelength range is limited to about 3 nm that can be changed with a temperature change, making it difficult to construct an optical network incorporating the features of the ROADM that positively uses wavelength resources.

Intensive research has been conducted on tunable lasers in order to solve the problems of the present DFB-LDs and achieve single-axial-mode oscillation in a wide range of wavelengths. One example of such research efforts is shown in "*Hikari Syuseki Devices* (Optical integrated devices)", written by Isao Kobayashi, first edition, second printing, Kyoritsu Shuppan Co., Ltd., December 2000, pages 104-122. Some examples described in this literature will be given below to describe conventional tunable lasers.

Tunable lasers are generally classified into two types, i.e., tunable lasers with a wavelength varying mechanism disposed in a laser element and tunable lasers with a wavelength varying mechanism disposed outside of a laser element.

One proposed tunable laser with a wavelength varying mechanism disposed in a laser element is a DBR-LD (Distributed Bragg Reflector Laser Diode) having an active region for producing a gain and a DBR region for producing a reflection with a diffraction grating, the active region and the DBR region being disposed in one laser element. The DBR-LD has a variable wavelength range of about 10 nm at maximum. There has also been proposed a DBR-LD employing a nonuniform diffraction grating which has an active region for producing a gain and front and rear DBR regions sandwiching the active region. The active region and the DBR regions are disposed in one laser element. In the front and rear DBR regions, the nonuniform diffraction grating produces a number of reflection peaks spaced at intervals that are slightly different in the front and rear DBR regions. Since this structure causes a vernier effect, the DBR-LD with the nonuniform diffraction grating makes it possible to change wavelengths in a very wide range, and can achieve wavelength varying operation in a range in excess of 100 nm and can achieve quasi-continuous wavelength varying operation in a range of 40 nm.

One proposed tunable laser with a wavelength varying mechanism disposed outside of a laser element is a tunable laser having a diffraction grating disposed outside of a laser element, the diffraction grating being rotatable to return light at a particular wavelength to the laser element. The tunable laser of this type requires a mechanism for sequentially monitoring oscillating wavelengths. Heretofore, a wavelength-selective component such as an etalon or the like is incorporated in the module for monitoring oscillating wavelengths.

Though many structures have been proposed for use as conventional tunable lasers, it has been difficult to put them to practical use because of various problems including mode hopping, complex wavelength control, weak vibration resistance, and high cost due to device enlargement.

The DBR-LD changes wavelengths by injecting carries into the DBR region to change the refractive index thereof. If crystal defects grow on account of the electric current injection, then the ratio of a refractive index change to the electric current injection changes greatly, making it difficult to maintain laser oscillation at a constant wavelength over a long period of time. Since the DBR-LD is of a complex structure, it tends to have a large size. According to the present compound semiconductor device fabrication process technology, it is impossible to increase the size of a laser substrate by 2 inches (50.8 mm) or more. Consequently, it is difficult to reduce the present price of DBR-LDs.

The tunable lasers with the wavelength varying mechanism disposed in the laser element are liable to bring about mode jumping due to vibration. These tunable lasers need a large vibration-resistant mechanism and tend to have a large module size and an increased cost. The tunable lasers also suffer an increased assembling cost as they require many optical components such as a photodetector in addition to the etalon for monitoring oscillating wavelengths. It has been customary to spatially couple the laser emitting surface and the etalon to each other with a lens for wavelength monitoring. According to the customary approach, a slight positional error of the etalon is apt to vary the accuracy of wavelengths. Therefore, the highly accurate mounting technology is required to install the etalon in position. However, the highly accurate mounting technology is also responsible for an increase in the assembling cost of tunable lasers.

SUMMARY OF THE INVENTION

It is an object of the present invention to provide a tunable laser which will solve the problems of the conventional tunable lasers, is highly reliable, is of high performance and low cost, and has a simple arrangement for monitoring wavelengths.

The above object can be achieved by a tunable laser comprising a multiple ring resonator comprising a plurality of ring resonators having respective ring-shaped waveguides and respective different optical path lengths, a first optical waveguide coupled to the multiple ring resonator, an optical input/output device coupled to the first optical waveguide, a second optical waveguide coupled to the multiple ring resonator, an optical reflector coupled to the second optical waveguide, the optical reflector removing light at an unwanted wavelength and reflecting light at a required wavelength, and a wavelength varying mechanism for changing the resonant wavelength of the multiple ring resonator.

In this tunable laser, light emitted from the optical input/output device is introduced into the first optical waveguide, and then travels successively through the multiple ring resonator, and the second optical waveguide to the optical reflector, and then travels back successively through the second optical waveguide and the multiple ring resonator and is applied as returning light from the first optical waveguide to the optical input/output device. Since the tunable laser employs the optical reflector which removes light in unwanted wavelengths and reflects light in a required wavelength, the returning light applied from the first optical waveguide to the optical input/output device is light in the fundamental mode, for example. The returning light becomes most intensive at the resonant wavelength of the multiple ring resonator because since the ring resonators of the multiple ring resonator have slightly different FSRs (Free Spectral Ranges), a greater reflection occurs at a wavelength (i.e., resonant wavelength) where periodic changes of reflections (transmissions) occurring in the respective ring resonators coincide with each other. The first optical waveguide is also referred to as an input/output side waveguide because the first optical waveguide is disposed between the multiple ring resonator and the optical input/output device, and the second optical waveguide is also referred to as a reflection side waveguide because the second optical waveguide is disposed between the multiple ring resonator and the optical reflector.

With this arrangement, light that passes through the through port of a ring resonator is minimum at the resonant wavelength of the multiple ring resonator. If an optical coupler for optically coupling the ring resonators is disposed in the multiple ring resonator, then the resonant wavelength of the multiple ring resonator can be detected by detecting the amount of light at the through port of the optical coupler.

The wavelength at which the periodic changes coincide with each other changes greatly depending on the circumferential lengths of the ring resonators and a change in the waveguide refractive index. Therefore, the tunable laser can operate efficiently to change the oscillation wavelength by changing the waveguide refractive index. The waveguide refractive index can be changed according to the thermooptical effect, for example. The thermooptical effect refers to a phenomenon in which the refractive index of a material increases as the temperature thereof increases. Any general materials exhibit the thermooptical effect to respective different extents. According to the present invention, the resonant wavelength of the multiple ring resonator can be changed based on the temperature characteristics of the ring resonators. The wavelength varying mechanism may heat or cool a ring resonator partly or wholly for changing the waveguide refractive index of the ring resonator. The wavelength varying mechanism may preferably comprise a film heater for heating the ring-shaped waveguide of the ring resonator.

According to the present invention, ring resonators whose circumferential lengths are slightly different from each other are coupled in series to each other, providing the multiple ring resonator, and the vernier effect provided by the multiple ring resonator is utilized to greatly change the resonant wavelength of the multiple ring resonator as a whole by changing the resonant wavelengths of the ring resonators.

The tunable laser according to the present invention may further includes a substrate on which the multiple ring resonator, the first optical waveguide, and the second optical waveguide may be disposed. The substrate comprises a PLC (Planar Lightwave Circuit) substrate, for example. As described above, the wavelength varying mechanism serves to change the resonant wavelength of the multiple ring resonator based on the temperature characteristics of each of the ring resonators, and specifically, the wavelength varying mechanism may comprise a film heater disposed on the substrate. As the film heater can easily be provided by depositing a metal film, for example, on the substrate, the film heater can easily be manufactured.

The optical reflector may preferably be a highly reflecting film disposed on an end face of the substrate, and the highly reflecting film may comprise a film such as a dielectric multilayer film, for example.

The optical input/output device may comprise a laser diode (hereinafter referred to as LD), a semiconductor optical amplifier (hereinafter referred to as SOA), an optical fiber amplifier, or the like.

The tunable laser according to the present invention may further comprise a photodetector for detecting light propagated through the multiple ring resonator, and a control circuit for controlling the wavelength varying mechanism based on the light detected by the optical detector. The photodetector may comprise a semiconductor photodetector such as a photodiode, a phototransistor, or the like, and detect light at the through port of either one of the ring resonators. The control circuit comprises a circuit for performing feedback control through the wavelength varying mechanism so that the resonant wavelength of light which is propagated through the multiple ring resonator will be constant.

Structural and operational details of the optical reflector provided in the tunable laser according to the present invention will be described below.

The wavelength varying range of a tunable laser which has a plurality of ring resonators is determined based on an FSR determined by the optical path length difference between the ring resonators. Though it is possible to reduce the optical path length difference to increase the FSR for the purpose of increasing the wavelength varying range, the FSR thus increased tends to make the oscillating characteristics unstable because the gain difference in the oscillation mode is reduced. When the tunable laser is designed, it is desirable to determined an FSR depending on a desired wavelength varying range for as high mode stability as possible. If the variable width of 35 nm in the C band or the L band is used as a target, then since the optical gain of the LD is of a wide value of 40 nm or greater, the tunable laser is liable to oscillate at wavelengths other than the FSR as the target. According to the present invention, the optical reflector is arranged such that light at certain wavelengths only can be reflected. As a result, the tunable laser is prevented from oscillating at wavelengths other than the desired FSR, and achieves stable oscillation in a single axial mode. According to the present invention, therefore, the reflectance of the optical reflector is made wavelength-dependent to achieve stable single-axial-mode oscillation in a desired wavelength range.

Next, filters provided as required in the tunable laser according to the present invention will be described below.

For the tunable laser to achieve high-output characteristics required by the user, it is necessary that a loss caused by each of the ring resonators be reduced maximally. According to the present invention, the optical reflector described above is provided, and a filter may be provided for preventing light in high-order modes from circulating through the ring resonators. Stated otherwise, the filter can prevent light in the high-order modes from circulating through the ring resonators in order to achieve good wavelength characteristics in the ring resonators. The introduction of a mode filter is effective to prevent the light in the high-order modes from being introduced into the multiple ring resonator and propagate only the light in the fundamental mode in the multiple ring resonator. The mode filter may comprise a constricted optical waveguide having a constricted portion or a bent optical waveguide having a certain radius of curvature. Alternatively, the mode filter may comprise an S-shaped optical waveguide made up of a combination of two bent waveguides. The mode filter increases the mode selectivity of the tunable laser, allowing the tunable laser to oscillate stably in a single axial mode. According to the present invention, therefore, the multiple ring resonator and the optical reflector which are combined with each other and the filter is further combined therewith to make it possible for the tunable laser to operate for good wavelength selection and also to oscillate stably in a single axial mode over a long period of time.

According to the present invention, though the tunable laser is of a simple structure for changing the resonant wavelength of the multiple ring resonator, it can achieve a large wavelength change based on a small operating action, and the multiple ring resonator and the optical reflector that is wavelength-dependent are combined with each other, making it possible for the tunable laser to operate for good wavelength selection and also to oscillate stably in a single axial mode over a long period of time. The tunable laser according to the present invention is more inexpensive, is of higher performance, and is more reliable than conventional tunable lasers. With the optical input/output device being disposed on the substrate on which the multiple ring resonator is mounted, the tunable laser can produce a laser beam in a very wide wavelength range by changing the resonant wavelength of the multiple ring resonator.

Since the tunable laser according to the present invention can change the oscillating wavelength without the need for the injection of an electric current injected into a semiconductor laser and also without the need for movable components, the tunable laser is highly reliable in operation. Specifically, since the tunable laser is of a simple arrangement in which the optical input/output device is mounted on the substrate on which the multiple ring resonator, the optical reflector, and the first and second optical waveguides are disposed, the tunable laser can be manufactured easily and inexpensively. The tunable laser according to the present invention does not require optical components such as an etalon or the like, can easily be assembled, and has a low module cost, but still has functions required by a transmission system in which the tunable laser is to be incorporated.

Stated otherwise, the tunable laser according to the present invention is of a simple structure free of an external mirror and is capable of changing wavelengths in a wider range than the ordinary DFB-LDs can change wavelengths. Furthermore, since the tunable laser has no movable components unlike ordinary external-mirror tunable lasers, the tunable laser is highly reliable in operation and is highly resistant to vibrations and shocks. As the tunable laser can be tuned for wavelengths by controlling the electric power supplied to the film heater, for example, any characteristic aging of the tunable laser is much smaller than tunable lasers which change wavelengths by injecting an electric current into a semiconductor waveguide.

As described above, the tunable laser according to the present invention is much more excellent than conventional tunable lasers, and is highly practically useful because it can be manufactured at a low cost.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 1:
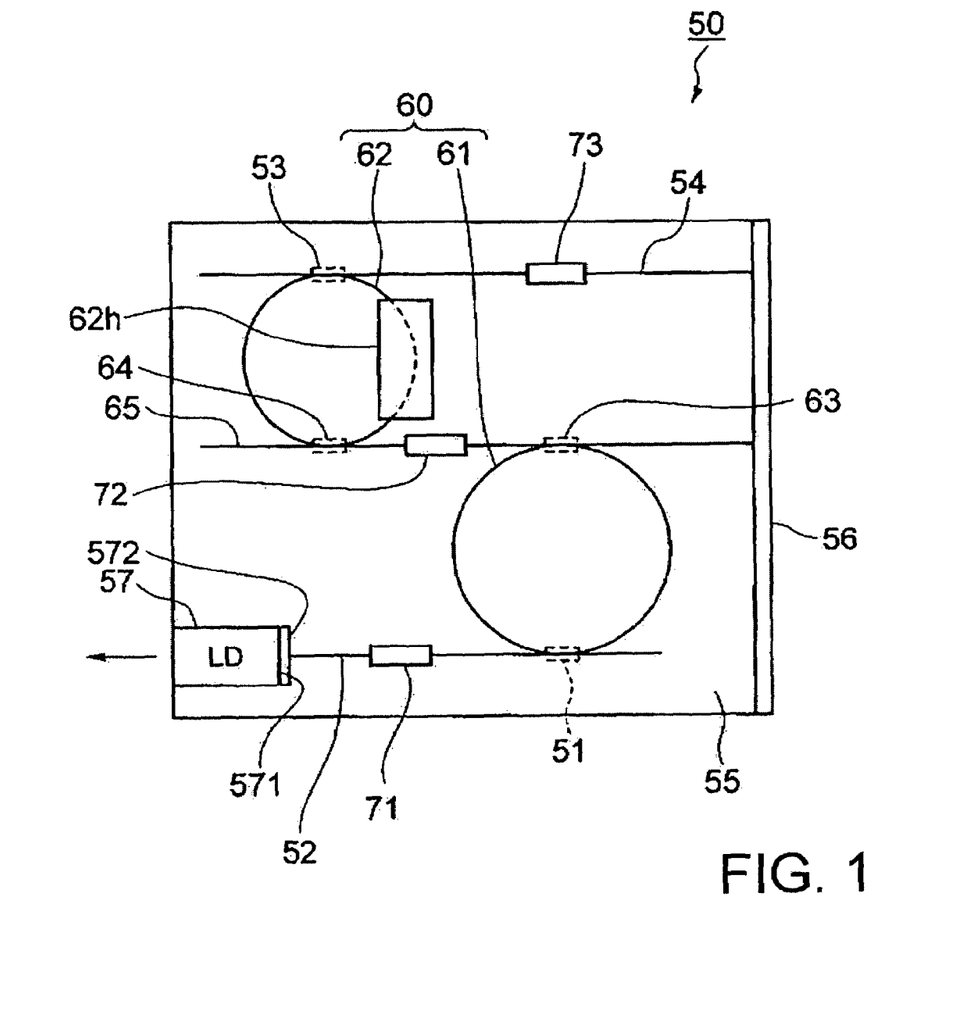
FIG. 1 is a plan view of a tunable laser according to a first embodiment of the present invention.

Tunable laser 50 according to a first embodiment of the present invention, shown in FIG. 1, has PLC substrate 55 with multiple ring resonator 60, input/output side waveguide 52, and reflection side waveguide 54 being disposed thereon. Multiple ring resonator 60 comprises two ring resonators 61, 62 having respective ring-shaped waveguides and respective different optical path lengths. Ring resonators 61, 62 are coupled to each other by directional couplers 63, 64 and coupling waveguide 65 thereby constituting multiple ring resonator 50. Input/output side waveguide 52 has an end coupled to ring resonator 61 by directional coupler 51. Reflection side waveguide 54 has an end coupled to ring resonator 62 by directional coupler 53. The other end of reflection side waveguide 54 extends to an end of PLC substrate 55 on which highly reflecting film 56 is disposed as an optical reflector. Therefore, highly reflecting film 56 is disposed at the other end of reflection side waveguide 54. Highly reflecting film 56 has a certain level of wavelength dependency and has properties for removing light in unwanted wavelengths and reflecting light in required wavelengths. Accordingly, of the light propagated to the other end of reflection side waveguide 54, only a required wavelength component is reflected by highly reflecting film 56 into reflection side waveguide 54, and travels toward the one end thereof that is coupled to ring resonator 62. Highly reflecting film 56 can be formed by evaporating or applying a dielectric multilayer film to the end face of PLC substrate 55. The wavelength dependency of highly reflecting film 56 will be described later on.

Mode filters 71, 72, 73 for preventing light in high-order modes from being introduced into multiple ring resonator 60 and propagating only light in a fundamental mode in multiple ring resonator 60 are built respectively in input/output side waveguide 52, coupling waveguide 65, and reflection side waveguide 54. Each of mode filters 71, 72, 73 comprises a constricted waveguide having a narrow local portion or a bent waveguide having a certain radius of curvature. Though it is preferable to have all three mode filters 71, 72, 73 used in tunable laser 50 for the purpose of better wavelength selectivity, only one or two mode filters may be used in tunable laser 50.

Ring resonators 61, 62 are fabricated according to the PLC technology. The various waveguides, which include the ring-shaped waveguides of ring resonators 61, 62, input/output side waveguide 52, reflection side waveguide 54, and coupling waveguide 65, comprise quartz glass optical waveguides made of quartz glass deposited on a silicon substrate or a glass substrate. Alternatively, the waveguides may be ferroelectric optical waveguides made of a thin film of ferroelectric material. The ferroelectric material of ferroelectric waveguides may be lithium niobate ($LiNbO_3$), for example.

Film heater 62h for changing the resonant wavelength of multiple ring resonator 60 is disposed over ring resonator 62. Film heater 62h comprises, for example, an aluminum (Al) film deposited on ring resonator 62, and the aluminum film has opposite ends serving as energizing electrodes. Film heater 62h can be deposited by evaporating or applying a metal film to PLC substrate 55, and may be made of platinum (Pt), chromium (Cr), or the like, rather than aluminum.

PLC substrate 55 may be mounted on a Peltier device (not shown) as a temperature adjusting mechanism, so that the overall temperature of PLC substrate 55 can be controlled. The Peltier device keeps the temperature of PLC substrate 55 constant in order to cause the FSR of ring resonator 61 to match the ITU grid.

LD 57, which serves as an optical input/output device, is coupled to the other end of input/output side waveguide 52 through nonreflecting film 572. LD 57 is directly mounted on PLD substrate 55 by the passive alignment technology. The passive alignment technology is a technology for positioning LD 57 using a mark pattern on the surface of PLC substrate 55 and a mark pattern on the chip of LD 57. The passive alignment technology does not require optical axis alignment which has heretofore been carried out in the fabrication of optical modules, and hence is effective in reducing the cost of fabricating optical modules and improving the lead time. Alternatively, LD 57 may be coupled to PLC substrate 55 by a lens, rather than being mounted on PLC substrate 55.

Operation of tunable laser 50 according to the first embodiment will be described below.

Light emitted from LD 57 enters from optical input/output end 571 into input/output side waveguide 52, and travels successively through mode filter 71, directional coupler 51, multiple ring resonator 60, mode filter 72, directional coupler 53, and reflection side waveguide 54, to which mode filter 73 is inserted, to highly reflecting film 56. The light is reflected by highly reflecting film 56, and travels successively through reflection side waveguide 54 and mode filter 73, directional coupler 53, multiple ring resonator 60, directional coupler 51, and input/output side waveguide 52, to which mode filter 71 is inserted, back to optical input/output end 571. The returning light has been reflected by highly reflecting film 56 having a predetermined wavelength dependency and has passed through mode filters 71, 72, 73. Therefore, the returning light is light in the fundamental mode. The returning light becomes most intensive at the resonant wavelength of multiple ring resonator 60 because since ring resonators 61, 62 of multiple ring resonator 60 have slightly different FSRs, a greater reflection occurs at a wavelength, i.e., the resonant wavelength, at which periodic changes of reflections (transmissions) occurring in respective ring resonators 61, 62 coincide with each other.

The wavelength at which the periodic changes coincide with each other changes greatly depending on the circumferential lengths of ring resonators 61, 62 and a change in the waveguide refractive index. The waveguide refractive index can be changed according to the thermooptical effect using film heater 62h. Specifically, the resonant wavelength of multiple ring resonator 60 can be changed based on the temperature characteristics of ring resonators 61, 62. With tunable laser 50 according to the present embodiment, as described above, ring resonators 61, 62 whose circumferential lengths or optical path lengths are slightly different from each other are coupled in series to each other, providing multiple ring resonator 60, and the vernier effect provided by multiple ring resonator 60 is utilized to achieve a wide range of variable wavelengths.

In tunable laser 50 according to the present embodiment, the waveguides, multiple ring resonator 60, and highly reflecting film 66 that are disposed on PLC substrate 55 function as a resonator with respect to a laser element, that is, LD 57. If a laser beam generated by tunable laser 50 is to be used in a WDM transmission system, for example, then the laser beam emitted from an end face of LD 57 remote from optical input/output end 571 is introduced into the WDM transmission system, as indicated by the arrow in FIG. 1.

Highly reflecting film 56 with a predetermined wavelength dependency will be described below.

Tunable laser 50 shown in FIG. 1 has LD 57 mounted on one end face of PLC substrate 55 and highly reflecting film 56 mounted on the other end face of PLC substrate 55. Highly reflecting film 56 is wavelength-dependent for reflecting light in a desired wavelength range to select an oscillating wavelength band. The wavelength varying range of the tunable laser of this type is determined based on an FSR determined by the optical path length difference between the ring resonators. Though it is possible to reduce the optical path length difference to increase the FSR, the FSR thus increased tends to make the oscillating characteristics unstable as described above. With the tunable laser of this type, it is desirable to determined an FSR depending on a desired wavelength varying range for as high mode stability as possible. If the variable width of 35 nm of the C band or the L band is used as a target, then since the optical gain of LD 57 is of a wide value of 40 nm or greater, the tunable laser is liable to oscillate at wavelengths other than the FSR as the target. According to the present embodiment, highly reflecting film 56 on the end face of PLC substrate 55 is arranged to reflect light at certain wavelengths only for thereby preventing the tunable laser from oscillating at wavelengths other than the desired FSR, but achieving stable oscillation in a single axial mode.

Figure 2A:
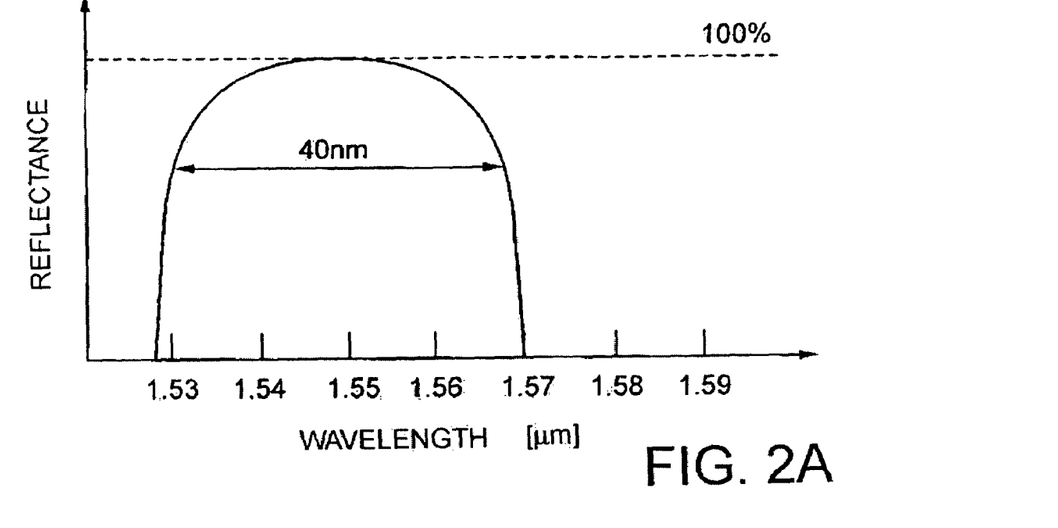
FIGS. 2A and 2B are graphs showing the relationship between wavelength and reflectance of highly reflecting films for use in the tunable laser shown in FIG. 1.
Figure 2B:
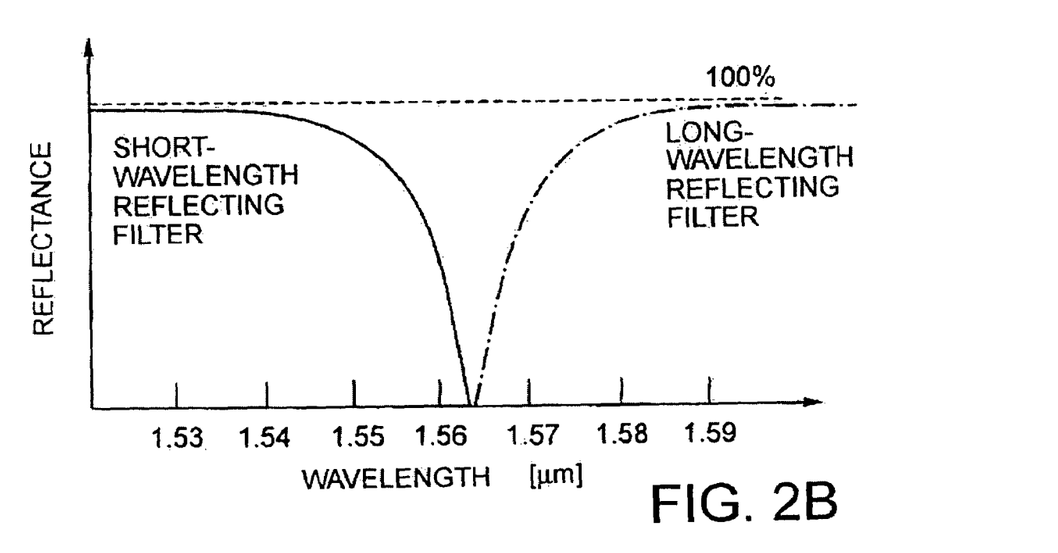

FIGS. 2A and 2B are graphs showing the relationship between wavelength and reflectance of highly reflecting films 56 for use in tunable laser 50 shown in FIG. 1.

An ordinary reflecting film is of high reflectance in a wide wavelength range of about 100 nm. FIG. 2A shows reflecting characteristics of highly reflecting film 56 according to a first example, which has a narrow reflecting wavelength range of about 40 nm. Therefore, highly reflecting film 56 shown in FIG. 2A is effective to fully suppressing laser oscillation in a wavelength range other than the narrow reflecting wavelength range of about 40 nm. The reflecting characteristics shown FIG. 2A can be achieved by a dielectric multilayer film made of a combination of $SiO_2$ and $Ta_2O_5$ or a combination of $SiO_2$ and $TiO_2$, for example. The dielectric multilayer film comprises an alternately laminated assembly of 5 to 50 layers of thin layers each having a thickness of about 0.2 μm or thick layers. Highly reflecting film 56 shown in FIG. 2A can set the reflecting wavelength range thereof only to the variable range of the resonant wavelength of multiple ring resonator 60. However, the dielectric multilayer film of highly reflecting film 56 may be optically designed to have a reflecting wavelength range slightly wider than the variable range of the resonant wavelength of multiple ring resonator 60.

Further, as indicated by the dot-and-dash-line curve in FIG. 2B, highly reflecting film 56 may be arranged to reflect light at wavelengths included in and longer than the variable range of the resonant wavelength of multiple ring resonator 60. Alternatively, as indicated by the solid-line curve in FIG. 2B, highly reflecting film 56 may be arranged to reflect light at wavelengths included in and shorter than the variable range of the resonant wavelength of multiple ring resonator 60. The reflecting wavelength range thus determined offers the same advantages as those described above. The highly reflecting film for reflecting light at the shorter or longer wavelengths as shown in FIG. 2B is of a simpler layer structure than the highly reflecting film for reflecting light in a certain wavelength range as shown in FIG. 2A.

As described above, tunable laser 50 according to the first embodiment is of a simple structure free of an external mirror and is capable of changing wavelengths in a wider range than the ordinary DFB-LDs can change wavelengths. Furthermore, since tunable laser 50 has no movable components unlike ordinary external-mirror tunable lasers, tunable laser 50 is highly reliable in operation and is highly resistant to vibrations and shocks. As tunable laser 50 is tuned for wavelengths by controlling the electric power supplied to film heater 62h, any characteristic aging of tunable laser 50 is much smaller than tunable lasers which change wavelengths by injecting an electric current into a semiconductor waveguide. Moreover, the wavelength dependency of highly reflecting film 56 allows tunable laser 50 to provide stable single-axial-mode oscillation characteristics in a desired wavelength range.

Tunable laser 50 according to the first embodiment may have a photodetector and a control circuit as described later.

Figure 3:
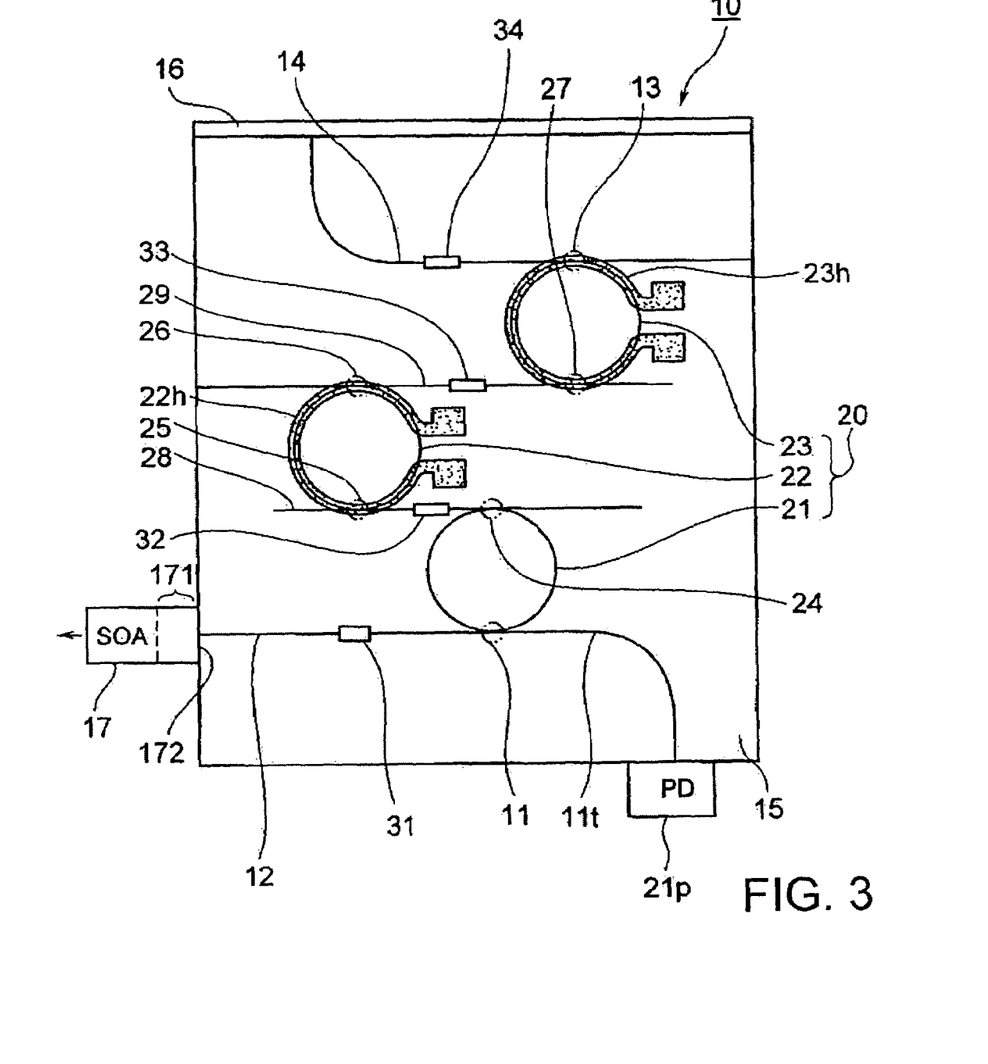
FIG. 3 is a plan view of a tunable laser according to a second embodiment of the present invention.

Tunable laser 10 according to a second embodiment of the present invention, shown in FIG. 3, has PLC substrate 15 with multiple ring resonator 20, input/output side waveguide 12, and reflection side waveguide 14 being disposed thereon. Multiple ring resonator 20 comprises three ring resonators 21, 22, 23 that are coupled by directional couplers 24, 25, 26, 27 and coupling waveguide 28, 29. Coupling waveguide 28 is coupled to ring resonators 21, 22 by respective directional couplers 24, 25, and coupling waveguide 29 is coupled to ring resonators 22, 23 by respective directional couplers 26, 27. Mode filters 31, 32, 33, 34 for preventing light in high-order modes from being introduced into multiple ring resonator 20 and propagating only light in a fundamental mode in multiple ring resonator 20 are built respectively in input/output side waveguide 12, coupling waveguide 28, coupling waveguide 29, and reflection side waveguide 14. Each of mode filters 31, 32, 33, 34 has a structure which may be in the form of a constricted waveguide including a constricted portion or a bent waveguide having a certain radius of curvature, as with the first embodiment. Though it is preferable to have all four mode filters 31, 32, 33, 34 used in tunable laser 10 for the purpose of better wavelength selectivity, only one or two or three mode filters may be used in tunable laser 10.

Input/output side waveguide 12 has an end coupled to ring resonator 21 by directional coupler 11. Directional coupler 11 has through port 11t connected to photodetector 21p for detecting the resonant wavelength of multiple ring resonator 20. Photodetector 21p may comprise a photodiode.

SOA (Semiconductor Optical Amplifier) 17 has optical input/output end 172 connected to the other end of input/output side waveguide 12 through a nonreflecting film (not shown), so that SOA 17 is coupled to input/output side waveguide 12. SOA 17 has phase control region 171 held in contact with optical input/output end 172 thereof. SOA 17 controls an electric current flowing through phase control region 171 to control the phase of light applied to or emitted from SOA 17. Since SOA 17 with phase control region 171 is of general nature, its structure and operating principles will not be described in detail below.

Reflection side waveguide 14 has an end coupled to ring resonator 23 by directional coupler 13. The other end of reflection side waveguide 14 extends to an end face of PLC substrate 15 on which highly reflecting film 16 is disposed as an optical reflector. In this configuration, highly reflecting film 16 is disposed at the other end of reflection side waveguide 14. Highly reflecting film 16 is a film for removing light in unwanted wavelengths and reflecting light in required wavelengths, and can be formed by evaporating or applying a dielectric multilayer film to the end face of PLC substrate 15. Accordingly, of the light propagated to the other end of reflective waveguide 14, only a required wavelength component is reflected by highly reflecting film 16 into reflection side waveguide 14, and travels toward the one end thereof that is coupled to ring resonator 12. Specific structural details of highly reflecting film 16 are the same as those of highly reflecting film 56 according to the first embodiment.

Ring resonators 21, 22, 23 are fabricated according to the PLC technology, for example. The various waveguides, which include the ring-shaped waveguides of ring resonators 21, 22, 23, input/output side waveguide 12, reflection side waveguide 14, and coupling waveguides 28, 29, comprise quartz glass optical waveguides made of quartz glass deposited on a silicon substrate or a glass substrate. Alternatively, ferroelectric optical waveguides made of a thin film of ferroelectric material, as with the first embodiment.

Film heaters 22h, 23h for changing the resonant wavelength of multiple ring resonator 20 are disposed corresponding to ring resonators 22, 23, respectively. Film heaters 22h, 23h comprise arcuate aluminum films deposited on respective ring resonators 22, 23. Each of the aluminum films has opposite ends serving as energizing electrodes. As with the first embodiment, film heaters 22h, 23h, which may be made of platinum, chromium, or the like, rather than aluminum, can be deposited by evaporating or applying a metal film to PLC substrate 15.

PLC substrate 15 may be mounted on a Peltier device (not shown) as a temperature adjusting mechanism, so that the overall temperature of PLC substrate 15 can be controlled, as with the first embodiment.

Operation principle of tunable laser 10 according to the second embodiment will be described below with reference to FIGS. 3 and 4.

Light emitted from SOA 17 enters from optical input/output end 172 into input/output side waveguide 12, and travels to highly reflecting film 16 successively through mode filter 31, directional coupler 11, multiple ring resonator 20 in which mode filters 32, 33 are inserted, directional coupler 13, and reflection side waveguide 14 in which mode filter 34 is inserted. The light is reflected by highly reflecting film 16, and travels back to optical input/output end 172 and hence SOA 17 successively through reflection side waveguide 14 in which mode filter 34 is disposed, directional coupler 13, multiple ring resonator 20 in which mode filters 32, 33 are disposed, directional coupler 11, input/output side waveguide 12 in which mode filter 31 is disposed. The returning light has been reflected by highly reflecting film 16 having a predetermined wavelength-dependency and has passed through mode filters 31, 32, 33, 34. Therefore, the returning light is light in the fundamental mode. The returning light becomes most intensive at the resonant wavelength of multiple ring resonator 20 because since ring resonators 21, 22, 23 of multiple ring resonator 20 have slightly different FSRs, a greater reflection occurs at a wavelength, i.e., the resonant wavelength, at which periodic changes of reflections (transmissions) occurring in respective ring resonators 21, 22, 23 coincide with each other. Light that passes through port 11*t* of directional coupler 11 becomes minimum at the resonant wavelength of multiple ring resonator 20. Therefore, the resonant wavelength of multiple ring resonator 20 can be detected by detecting the amount of light at through port 11*t* with photodetector 21*p*.

The resonant wavelength, i.e., the wavelength at which the periodic changes coincide with each other changes greatly depending on the circumferential lengths of ring resonators 21, 22, 23 and a change in the waveguide refractive index. The waveguide refractive index can be changed according to the thermooptical effect. Specifically, the resonant wavelength of multiple ring resonator 20 can be changed based on the temperature characteristics of ring resonators 22, 23 by controlling the amount of electric current flowing through film heaters 22*h*, 23*h*. At this time, the wavelength of light emitted from SOA 17 is changed by controlling the amount of electric current flowing through phase control region 171. With the tunable laser according to the present embodiment, as described above, ring resonators 21, 22, 23 whose circumferential lengths or optical path lengths are slightly different from each other are coupled in series to each other, providing multiple ring resonator 20, and the vernier effect provided by multiple ring resonator 20 is utilized and the amount of electric current flowing through phase control region 171 is controlled to achieve a wide range of variable wavelengths.

In tunable laser 10 according to the present embodiment, the waveguides, multiple ring resonator 20, and highly reflecting film 16 that are disposed on PLC substrate 15 function as al resonator with respect to a laser element, i.e., SOA 17. If a laser beam generated by tunable laser 10 is to be used in a WDM transmission system, for example, then the laser beam emitted from an end face of SOA 17 remote from optical input/output end 172 is introduced into the WDM transmission system, as indicated by the arrow in FIG. 3.

Figure 4:
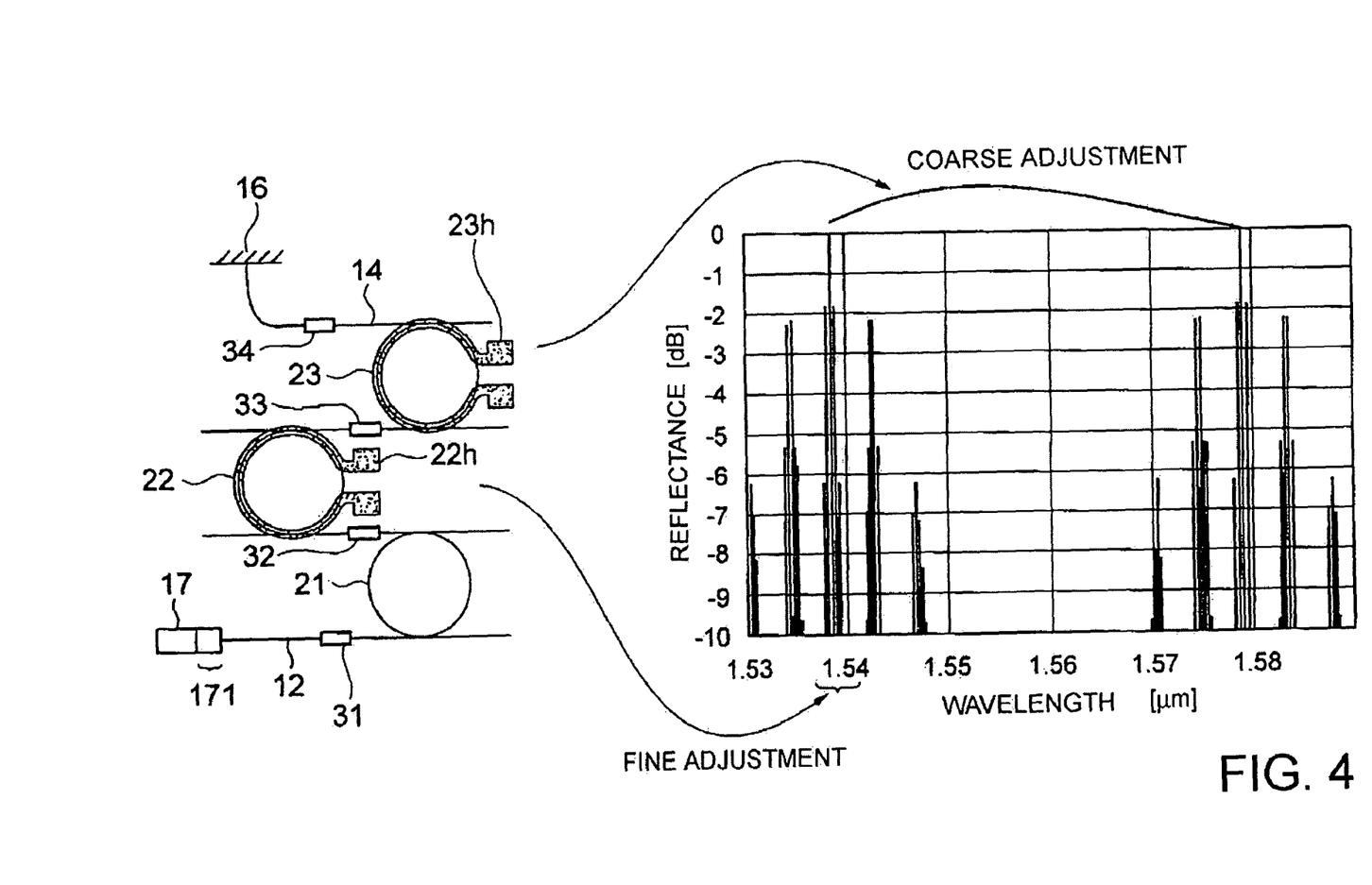
FIG. 4 is a diagram illustrating the operating principles of the tunable laser shown in FIG. 3.

FIG. 4 shows the relationship between wavelength and reflectance observed when ring resonators 21, 22, 23 of tunable laser 10 shown in FIG. 3 had circumferential lengths or optical path lengths of 4000 μm, 4400 μm, and 4040 μm, respectively. The reflectance is used with respect to light emitted from SOA 17, propagated through multiple ring resonator 20, and returned to SOA 17. Film heater 22*h* is used for fine adjustment of the wavelength, and film heater 23*h* is used for coarse adjustment of the wavelength. Furthermore, wavelengths on the order of several tens of picometers (pm) are controlled by changing the amount of electric current flowing through phase control region 171 of SOA 17.

Figure 5:
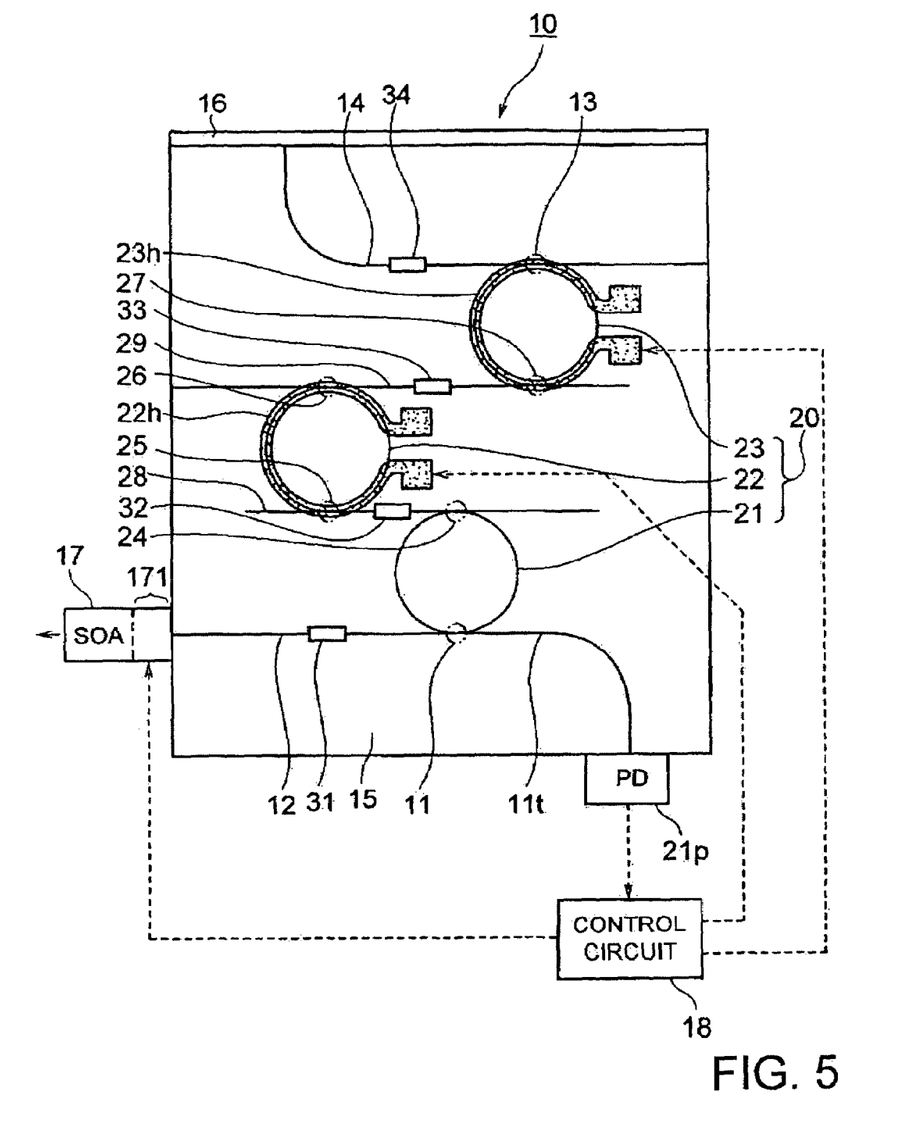
FIG. 5 is a plan view of a modified tunable laser which comprises the tunable laser shown in FIG. 3 and a control circuit added thereto.

FIG. 5 shows in plan a modified tunable laser which comprises tunable laser 10 shown in FIG. 3 and a control circuit added thereto. Those parts of the tunable laser shown in FIG. 5 which are identical to those of tunable laser 10 shown in FIG. 3 are denoted by identical reference characters, and will not be described in detail below.

Control circuit 18 that is added to tunable laser 10 mainly comprises a processor such as a DSP (Digital Signal Processor) or an MPU (Micro processing Unit), and a memory for storing a program to be executed by the processor. Control circuit 18 controls the amounts of electric current flowing through film heaters 22*h*, 23*h* and phase control region 171 in order to minimize the amount of light detected by photodetector 21*p*, i.e., to maintain the resonant wavelength at a constant value. For example, control circuit 18 controls the amounts of electric current flowing through film heaters 22*h*, 23*h* and phase control region 171, thereby changing the wavelength in a sinusoidal fashion, and searches for a wavelength at which the amplitude of a photoelectric current generated by photodetector 21*p* becomes minimum. The wavelength thus searched for is the wavelength to be determined.

Tunable laser 10 according to the second embodiment will generally be described below with reference to FIGS. 3 to 5.

Tunable laser 10 is of such a structure as to select a resonant mode for oscillation in a single axial mode, using the wavelength transmittance characteristics of the drop ports of ring resonators 21, 22, 23. Three ring resonators 21, 22, 23 of multiple ring resonator 20 have slightly different circumferential lengths. Since the resonant peak wavelengths of three ring resonators 21, 22, 23 coincide with each other only once in a wide wavelength range of several tens of nanometers (nm), and also since the mode selectivity is increased by highly reflecting film 16 having wavelength-dependency, tunable laser 10 is capable of oscillating stably in a single axial mode.

The wavelength is changed mainly by changing the amounts of electric current flowing through film heaters 22*h*, 23*h* on ring resonators 22, 23. Output light from through port 11*t* of ring resonator 21 that is free of a film heater is extracted and converted by photodetector 21*p* into an electric current to detect a wavelength error. Output light can be extracted from not only the drop ports of ring resonators 21, 22, 23, but also the through ports thereof which have a wavelength blocking capability. According to the present embodiment, wavelengths are detected using output light from the through ports.

The tunable laser according to the present embodiment resides mainly in that it has photodetector 21*p* for detecting light from through port 11*t* and the FSR of ring resonator 21 for dividing detected light matches the ITU grid. The latter feature allows the oscillating wavelength to be obtained as a discrete wavelength matching the ITU grid according to single-axial-mode oscillation. At this time, the wavelength selectivity of mode filters 31, 32, 33, 34 acts effectively. However, a problem arises in that a deviation from the ITU grid is unknown. According to the present embodiment, this problem is solved by controlling the phase of ring resonators 22, 23 which operate to change the wavelengths, or the phase of SOA 17 in order to minimize the output light from through port 11*t* of ring resonator 21. Specifically, wavelength control is performed precisely by slightly changing the wavelength and selecting a wavelength to minimize the amplitude of a detected signal that is produced as a result.

The present invention is not limited to the above embodiments. The multiple ring resonator is not limited to comprising two or three ring resonators, but may have four or more ring resonators that are interconnected. The ring resonators may be directly connected only by directional couplers. The LD or SOA and the multiple ring resonator may be monolithically integrated on one substrate.

While preferred embodiments of the present invention have been described using specific terms, such description is for illustrative purposes only, and it is to be understood that changes and variations may be made without departing from the spirit or scope of the following claims.

What is claimed is:

1. A tunable laser comprising:
    a multiple ring resonator comprising a plurality of ring resonators having respective ring-shaped waveguides and respective different optical path lengths, the ring-shaped waveguides having circumferential lengths different from each other, the ring-shaped waveguides being connected in series;
    a first optical waveguide coupling a first ring resonator to said multiple ring resonator;
    a single optical input/output device directly coupled to said first optical waveguide, said optical input/output device being a laser diode or a semiconductor optical amplifier adapted to provide a single optical signal to a last ring resonator of the multiple ring resonator;
    a second optical waveguide coupled to said multiple ring resonator;
    an optical reflector coupled to said second optical waveguide, said optical reflector removing light at an unwanted wavelength and reflecting light at a required wavelength;
    at least one third optical waveguide coupling adjacent ring resonators; and
    a wavelength varying mechanism for changing the resonant wavelength of said multiple ring resonator,
    wherein a free spectral range (FSR) of each ring resonator is different from one another, and a resonant wavelength changes depending on the circumferential lengths of the ring resonators.

2. The tunable laser according to claim 1, further comprising a substrate, wherein said multiple ring resonator, said first optical waveguide, and said second optical waveguide are disposed on said substrate.

3. The tunable laser according to claim 2, wherein said optical reflector has a reflecting film.

4. The tunable laser according to claim 1, wherein said optical reflector comprises a dielectric multilayer film.

5. The tunable laser according to claim 3, wherein said reflecting film comprises a dielectric multilayer film disposed on an end face of said substrate.

6. The tunable laser according to claim 1, wherein said optical reflector reflects only light in a wavelength varying range of said wavelength varying mechanism.

7. The tunable laser according to claim 1, wherein said optical reflector reflects at least light having a wavelength in a wavelength varying range of said wavelength varying mechanism.

8. The tunable laser according to claim 1, wherein said optical reflector reflects light at wavelengths included in and longer than a wavelength varying range of said wavelength varying mechanism.

9. The tunable laser according to claim 1, wherein said optical reflector reflects light at wavelengths included in and shorter than a wavelength varying range of said wavelength varying mechanism.

10. The tunable laser according to claim 1, further comprising at least one mode filter for preventing light in high-order modes from being introduced into said multiple ring resonator and propagating light in a fundamental mode in said multiple ring resonator, said at least one mode filter being built in at least one of said first optical waveguide, said second optical waveguide or said third optical waveguide.

11. The tunable laser according to claim 1, further comprising:
    a photodetector for detecting light propagated through said multiple ring resonator; and
    a control circuit for controlling said wavelength varying mechanism based on the light detected by said optical detector.

12. The tunable laser according to claim 11, wherein said wavelength varying mechanism comprises a heater for changing the temperature of at least a portion of said multiple ring resonator.

13. The tunable laser according to claim 2, wherein said substrate comprises a PLC substrate.

14. The tunable laser according to claim 11, wherein said optical detector comprises a semiconductor photodetector.

15. The tunable laser according to claim 5, further comprising:
    a photodetector for detecting light propagated through said multiple ring resonator; and
    a control circuit for controlling said wavelength varying mechanism based on the light detected by said optical detector.

16. The tunable laser according to claim 15, wherein said wavelength varying mechanism comprises a heater for changing the temperature of at least a portion of said multiple ring resonator, said substrate comprises a PLC substrate, said photodetector comprises a semiconductor photodetector, and said control circuit comprises a circuit for controlling an amount of electric current flowing through said heater to minimize an amount of light detected by said semiconductor photodetector.

17. The tunable laser according to claim 5, wherein said optical reflector reflects only light in a wavelength varying range of said wavelength varying mechanism.

18. The tunable laser according to claim 5, wherein said optical reflector reflects at least light having a wavelength in a wavelength varying range of said wavelength varying mechanism.

19. The tunable laser according to claim 5, wherein said optical reflector reflects light at wavelengths included in and longer than a wavelength varying range of said wavelength varying mechanism.

20. The tunable laser according to claim 5, wherein said optical reflector reflects light at wavelengths included in and shorter than a wavelength varying range of said wavelength varying mechanism.

21. The tunable laser according to claim 5, further comprising at least one mode filter for preventing light in high-order modes from being introduced into said multiple ring resonator and propagating light in a fundamental mode in said multiple ring resonator, said at least one mode filter being built in at least one of said first optical waveguide, said second optical waveguide or said third optical waveguide.

22. The tunable laser according to claim 1, further comprising a directional coupler coupling each optical waveguide to its respective ring resonator.

23. The tunable laser according to claim 1, wherein the first optical waveguide, the second optical waveguide and the third optical waveguide are each a straight optical waveguide.

* * * * *